United States Patent
Iwawaki (10) Patent No.: US 9,176,585 B2
(45) Date of Patent: Nov. 3, 2015

(54) TOUCH PANEL SUPPORT

(71) Applicant: SMK Corporation, Tokyo (JP)

(72) Inventor: Shinya Iwawaki, Toyama (JP)

(73) Assignee: SMK Corporation, Tokyo (JP)

(*) Notice: Subject to any disclaimer, the term of this patent is extended or adjusted under 35 U.S.C. 154(b) by 99 days.

(21) Appl. No.: 14/032,200

(22) Filed: Sep. 20, 2013

(65) Prior Publication Data

US 2014/0209445 A1 Jul. 31, 2014

(30) Foreign Application Priority Data

Jan. 29, 2013 (JP) ................. 2013-014401

(51) Int. Cl.
*G02F 1/1335* (2006.01)
*G06F 3/01* (2006.01)
*G06F 3/044* (2006.01)

(52) U.S. Cl.
CPC ............ *G06F 3/016* (2013.01); *G06F 3/044* (2013.01); *H03K 2217/96062* (2013.01)

(58) Field of Classification Search
CPC ............ G06F 3/016; G06F 3/044; H03K 2217/96062
See application file for complete search history.

(56) References Cited

U.S. PATENT DOCUMENTS

| 2010/0110033 A1* | 5/2010 | Sakai ................. 345/173 |
| 2013/0017867 A1* | 1/2013 | Lee et al. ............. 455/566 |
| 2015/0009176 A1* | 1/2015 | Inata et al. ............ 345/174 |

FOREIGN PATENT DOCUMENTS

| JP | 2011-53745 A | | 3/2011 |
| JP | 2012/173955 A | * | 9/2012 |
| JP | 2012-173955 A | | 9/2012 |

OTHER PUBLICATIONS

Office Action issued for counterpart Japanese Application 2013-014401, issued by the Japanese Patent Office on Dec. 24, 2014.

* cited by examiner

*Primary Examiner* — Richard Kim
*Assistant Examiner* — Ryan Crockett (57) ABSTRACT

A touch panel support which has a full flat surface and an outstanding operability is provided. The touch panel support includes a touch panel assembly and a case assembly for supporting the touch panel assembly. The touch panel assembly has, on the periphery thereof, a stepped engagement part which is lower than the surface of the touch panel assembly. The case assembly has a case main body for accommodating the touch panel assembly so as to allow a force feedback perpendicular vibration thereof and a bezel which is secured to the opening of the case main body. The bezel is engaged with the engagement part of the touch panel assembly so as not to inhibit the perpendicular vibration of the touch panel assembly. The surfaces of the touch panel assembly and the bezel are formed to be flush with each other.

4 Claims, 7 Drawing Sheets

TOUCH PANEL SUPPORT

CROSS REFERENCE TO RELATED APPLICATION

The contents of the following Japanese patent application are incorporated herein by reference,
NO. 2013-14401 filed on Jan. 29, 2013.

BACKGROUND

1. Technical Field

The present invention relates to a touch panel support to be used to operate electronic devices, and more particularly to a support structure for a force feedback type (sense-of-touch feedback type) touch panel assembly.

2. Description of the Related Art

The touch panel is an electronic device into which a display device such as a liquid crystal panel and a position input device like a touch pad are combined. The touch panel assembly serving as the touch pad can employ a number of schemes, which have been suggested, such as the resistance membrane scheme, the electrostatic capacitance scheme, the surface acoustic wave scheme, the infrared scheme, and the electromagnetic induction scheme. In the case of mobile devices, there are growing needs for a force feedback type touch panel (also referred to as the sense-of-touch feedback type) which is configured to provide the feeling of input operations.

Recent years have seen the widespread use of the electrostatic capacitance scheme touch panel assembly which facilitates fingertip touch input and scrolling operations.

Conventionally, the frame-shaped bezel surface for protecting the periphery of the touch panel assembly was projected in a step height shape from the touch panel surface. This has led to a possibility of causing an obstacle to input operations.

Figure 2:
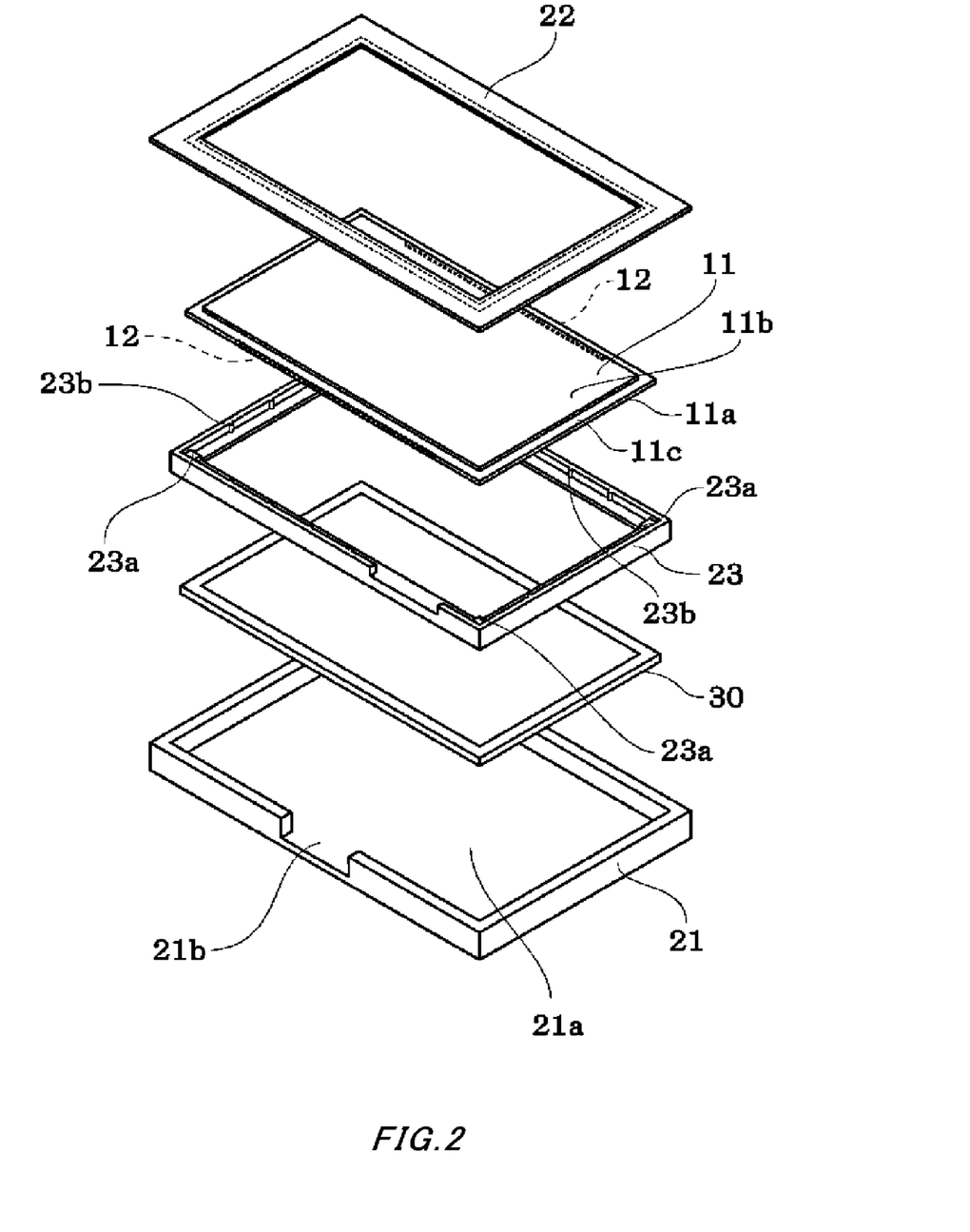
FIG. 2 is a schematic view illustrating the configuration of parts of the touch panel support.

Disclosed in Japanese Patent Application Publication No. 2011-53745 is a mounting structure of the resistance membrane scheme sense-of-touch feedback type touch panel with the surface flattened as shown in FIG. 2.

However, the structure disclosed in the Publication is configured, as described in paragraph (0060), such that the sense-of-touch feedback type touch panel is mounted onto the housing by being fitted from outside over the housing. This structure may lead to a possibility of causing the touch panel to be dislodged from the housing by accident.

SUMMARY

An object of the present invention is to provide a touch panel support which has a full flat surface and provides an outstanding operability.

The touch panel support according to the present invention includes a touch panel assembly and a case assembly for supporting the touch panel assembly. The touch panel support is configured such that the touch panel assembly has, on the periphery thereof, a stepped engagement part which is lower than the surface of the touch panel assembly; the case assembly includes a case main body for accommodating the touch panel assembly so as to allow a force feedback perpendicular vibration and a bezel which is secured to the opening of the case main body; the bezel is engaged with the engagement part of the touch panel assembly so as not to inhibit the perpendicular vibration of the touch panel assembly; and the surface of the touch panel assembly and the surface of the bezel are formed to be flush with each other.

Here, the perpendicular vibration of the touch panel means the vibration of the touch panel in a direction perpendicular to the front and rear planar surfaces.

On the other hand, the force feedback refers to a type of the so-called sense-of-touch feedback that a contact made by an operator touching the surface of the touch panel or performing a scrolling operation is sensed causing the touch panel assembly to vibrate, thereby providing improved feeling of operations.

The touch panel assembly of the present invention refers to an input device part which is disposed by being superimposed with a display device such as a liquid crystal panel. The display device is accommodated in the case main body, and the touch panel assembly is then accommodated on top of the display device. To support and protect the display device and the touch panel assembly in the case main body, a frame-shaped bezel is secured to the case main body so as to be disposed around the touch panel assembly.

The present invention is characterized in that the surface of the touch panel assembly and the surface of the bezel are formed to be full flat and substantially flush with each other, and the touch panel assembly is engaged with the bezel so as not to inhibit the perpendicular vibration of the touch panel assembly.

Here, a unit for engaging the touch panel assembly with the bezel is configured to be engaged with the stepped engagement part on the periphery of the touch panel so as not to prevent the touch panel assembly from being dislodged from the bezel, while a predetermined clearance is ensured between the bezel and the peripheral front and side surfaces of the touch panel assembly so that the touch panel assembly can vibrate in a perpendicular direction.

Note that a cushion which is soft enough not to inhibit the vibration may be interposed between the touch panel assembly and the bezel in order to prevent dust particles from entering through the gaps having the aforementioned clearances as well as to prevent unwanted looseness of the touch panel assembly.

In the present invention, a unit for vibrating the touch panel assembly in the perpendicular direction is not limited to a particular one, but may be a piezoelectric element, a vibration motor, a solenoid, or a shape storage alloy element. Among them, since the piezoelectric element can convert an electrical signal to a variation by expansion and contraction, a band-shaped piezoelectric element affixed onto the rear surface of the touch panel assembly causes the rear surface of the touch panel assembly to be deflected so as to be inwardly curved when the piezoelectric elements are contracted.

Since such a variation by deflection readily vibrates the touch panel assembly in the perpendicular direction, use of a band-shaped elongated piezoelectric element simplifies the structure.

The present invention can also be configured such that the case main body may have a mounting part for receiving the touch panel assembly at the four corners of the touch panel assembly, and the touch panel assembly may be an electrostatic capacitance type touch panel assembly, with the array of piezoelectric elements affixed to the rear surface of the touch panel assembly.

The electrostatic capacitance touch panel assembly has a sensor portion which is formed from an ITO pattern on the surface of a panel such as a glass substrate. The outer periphery of the glass substrate may be selectively reduced in thickness to thereby directly form the stepped engagement part on the glass substrate, whereby the surface of the touch panel assembly and the surface of the bezel are made full flat and flush with each other.

On the other hand, the sensor portion may be often formed on the surface of a panel such as a glass substrate and covered with an overcoat. Thus, the touch panel assembly may include the panel main body and a design panel so as to form the engagement part by affixing the design panel to the surface of the panel main body, the design panel having a smaller outer shape than that of the panel main body.

In this case, the surfaces of the design panel and the bezel which constitute the touch panel assembly are formed to be flush with each other.

Here, being formed to be flush with each other means being substantially full flat while allowing the perpendicular vibration of the touch panel assembly.

The touch panel support according to the present invention is configured such that the touch panel assembly is provided, on the periphery thereof, with a stepped engagement part which is lower than the surface of the touch panel assembly and the inner periphery of the rear surface of the bezel is engaged with the engagement part without inhibiting the perpendicular vibration of the touch panel assembly. It is thus possible to make the touch panel support full flat without a step height between the surface of the touch panel assembly and the surface of the bezel as well as to prevent the touch panel assembly from being dislodged from the bezel.

DESCRIPTION OF EXEMPLARY EMBODIMENTS

Now, a description will be made below to an example structure of a touch panel support according to the present invention with reference to the accompanying drawings. However, the present invention will not be limited to this embodiment.

Figure 1A:
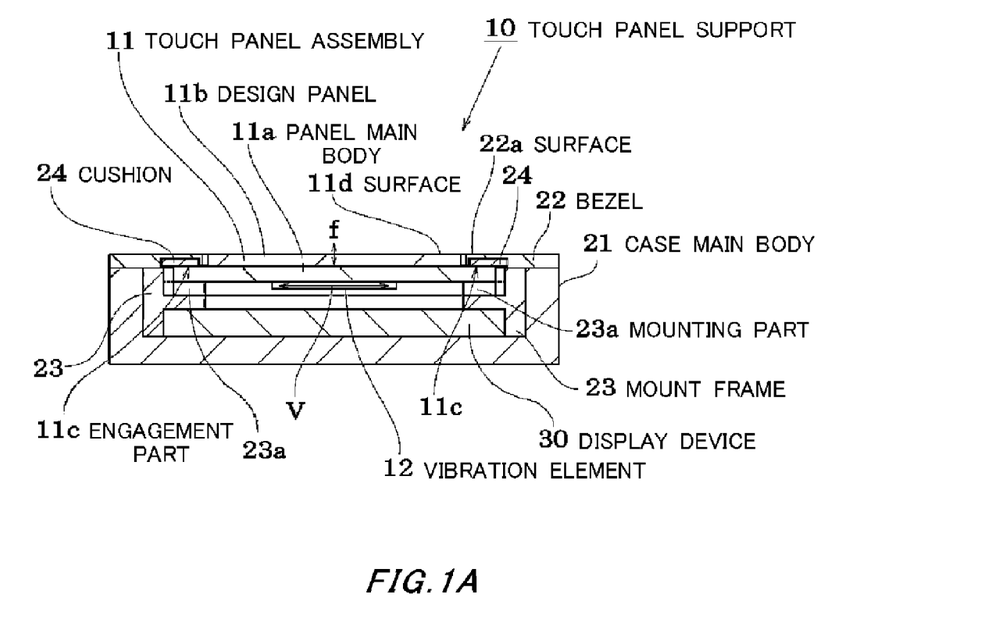
FIGS. 1A and 1B each shows a cross-sectional view of a touch panel support according to the present invention, FIG. 1A being an overall cross-sectional view and FIG. 1B being a cross-sectional perspective view illustrating a corner of the touch panel support.
Figure 1B:
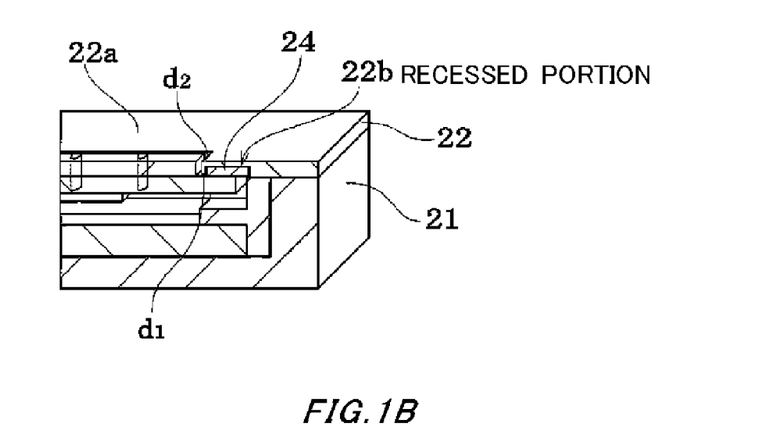
Figure 3:
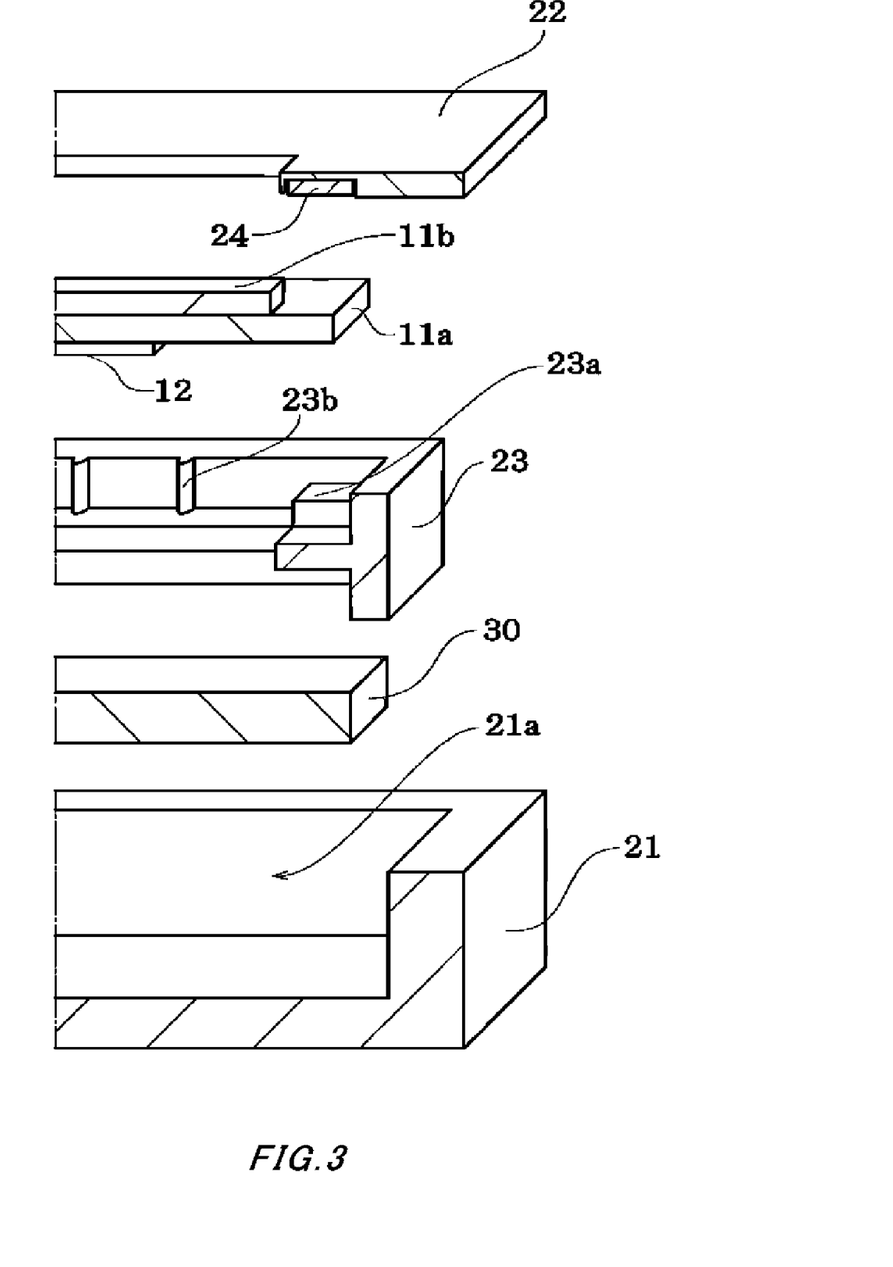
FIG. 3 is an enlarged view illustrating the parts at a corner of the touch panel support.

As FIGS. 2 and 3 schematically illustrate the configuration of parts and FIGS. 1A and 1B each show a cross-sectional view, the touch panel support 10 accommodates a touch panel assembly 11 or the like in a case assembly. The case assembly is made up of a case main body 21 and a bezel 22 and has a generally rectangular outer shape when viewed from above. In the case main body 21 including an inwardly recessed accommodating space, a display device 30 such as a liquid crystal panel and the touch panel assembly 11 are accommodated, with the bezel 22 serving as a frame secured to the opening of the case main body 21.

The touch panel assembly 11 according to this embodiment is an electrostatic capacitance type touch panel which is fabricated by forming a sensor portion of ITO film (not illustrated) on a surface of a panel main body 11a made up of a transparent glass substrate, and then bonding a design panel 11b onto the top thereof, the design panel 11b being made of a transparent plastic substrate such as an acrylic resin.

The design panel 11b has an outer shape which is smaller than the outer shape of the panel main body 11a, so that there will be formed a stepped engagement part 11c on the periphery when bonding is carried out as shown in FIG. 2.

As shown in FIG. 1A, this stepped part allows the surface 11d of the design panel 11b and the surface 22a of the bezel 22 to be flush with each other and full flat.

Note that the invention is not limited to this embodiment so long as the stepped engagement part 11c is formed on the periphery of the touch panel assembly 11.

Figure 6A:
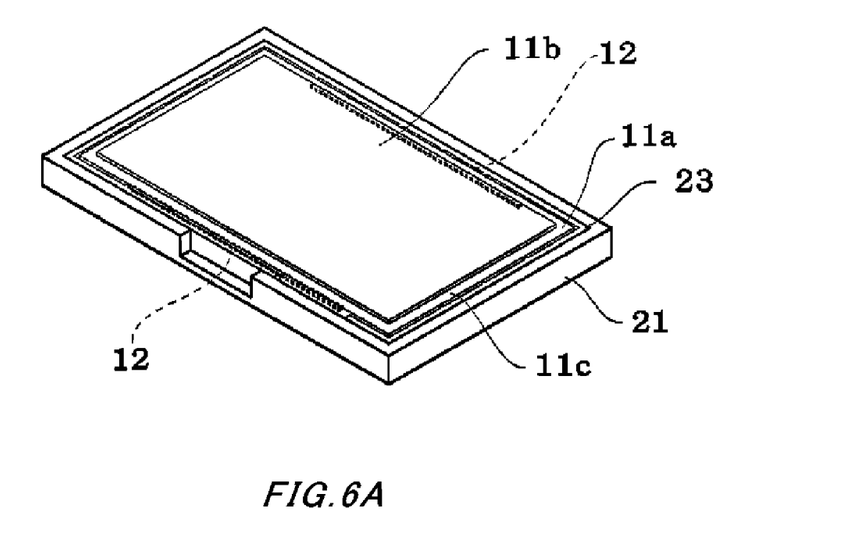
FIG. 6A is a view illustrating the touch panel support with the bezel removed and FIG. 6B illustrating an enlarged view of a corner.
Figure 6B:
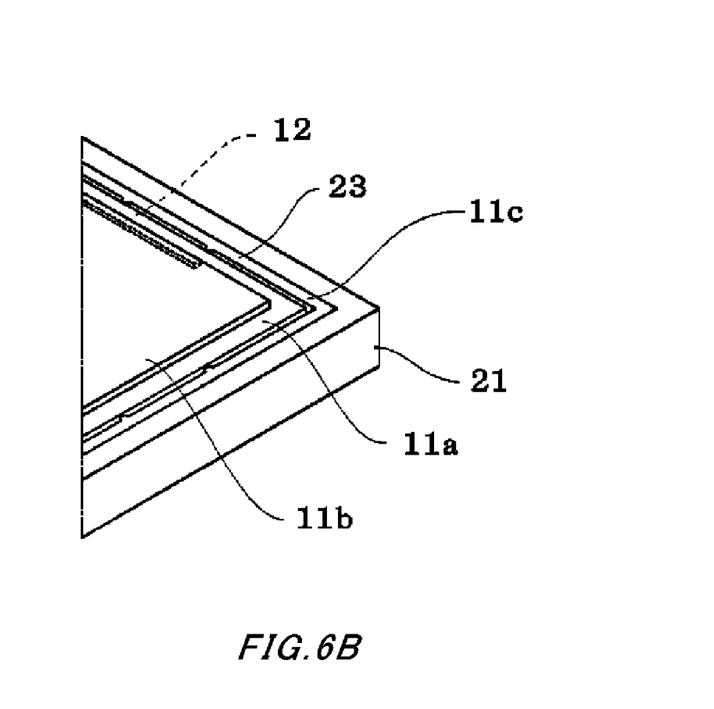

As shown in FIGS. 6A and 6B, vibration elements 12 or two arrays of piezoelectric elements are bonded onto the rear surface of the panel main body 11a so as to oppose to each other along the longitudinal side edges of the panel main body 11a.

Although not illustrated, for example, a fingertip touch on the surface of the touch panel would cause the piezoelectric elements to be varied by expansion and contraction due to an electric current delivered from a control unit upon reception of a signal generated by the touch. This variation causes deflective variations to occur on the panel main body 11a, thereby resulting in the panel main body 11a being curved.

This deflective variation is conveyed to the fingertip or the like as the perpendicular vibration.

In this context, to support and sustain the touch panel assembly 11 while retarding the attenuation of the perpendicular vibration, this embodiment is provided, as shown in FIG. 2, with a rubber mount frame 23 and a block-shaped mounting part 23a at each of the four corners of the mount frame. The touch panel assembly 11 was placed so as to bridge between these four mounting parts 23a.

Note that the mounting parts 23a may be directly provided on the case main body 21.

Placing the touch panel assembly 11 on the mounting parts at the four corners in this manner would allow a space to be created on the rear surface of the touch panel assembly 11, the space facilitating the perpendicular vibration of the touch panel assembly 11 and serving to receive the piezoelectric elements.

Now, a description will be made to the relationship between the touch panel assembly 11 and the bezel 22.

Figure 5A:
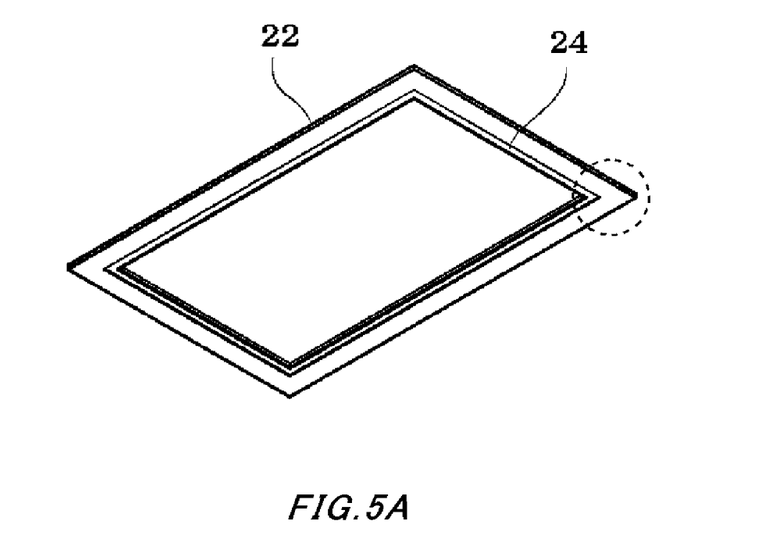
FIG. 5A is a view illustrating the rear surface of the bezel and FIG. 5B illustrating an enlarged view of a corner indicated by a dot-dash circle in FIG. 5A.
Figure 5B:
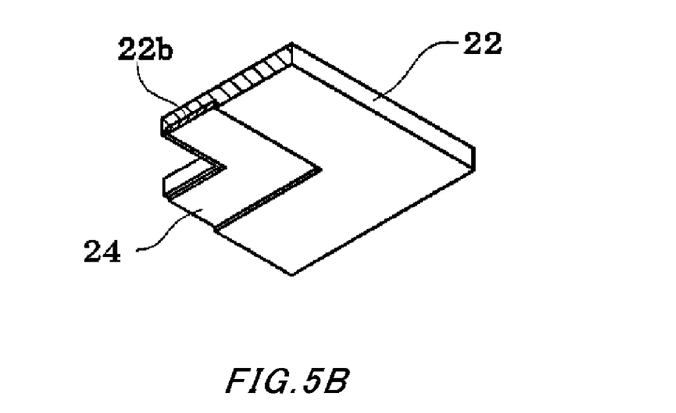

As shown in FIGS. 5A and 5B, the bezel 22 has a frame-like shape and forms a groove-shaped recessed portion 22b along the inner periphery on the rear surface of the frame, with a soft frame-shaped cushion 24 provided in a prescribed manner along the recessed portion.

On the other hand, as shown in FIGS. 6A and 6B, the touch panel assembly 11 has, on the periphery thereof, the stepped engagement part 11c which is formed so as to be lower than the surface of the touch panel assembly 11. To allow the cushion 24 to be positioned on the upper surface of the engagement part, the bezel 22 is secured with screws or the like to the case main body 21.

Figure 4A:
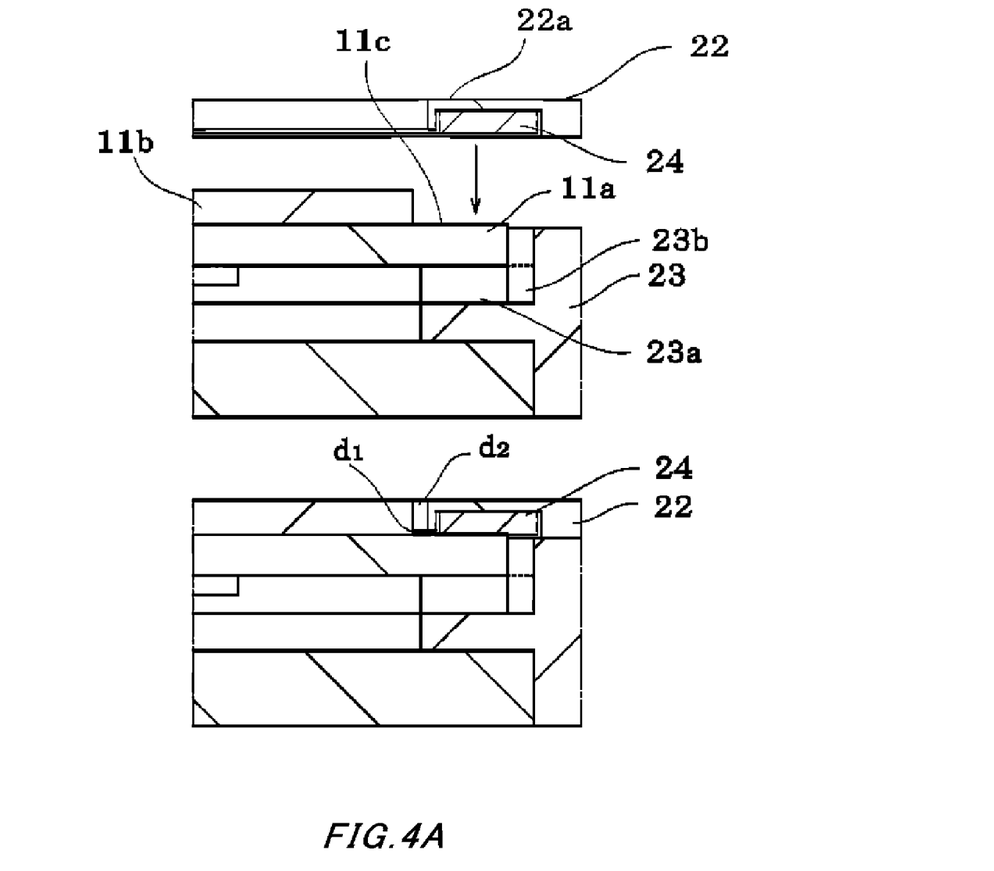
FIG. 4A is a view illustrating the touch panel assembly incorporated in a case main body and FIG. 4B illustrating the full flat surface of the touch panel support.
Figure 4B:
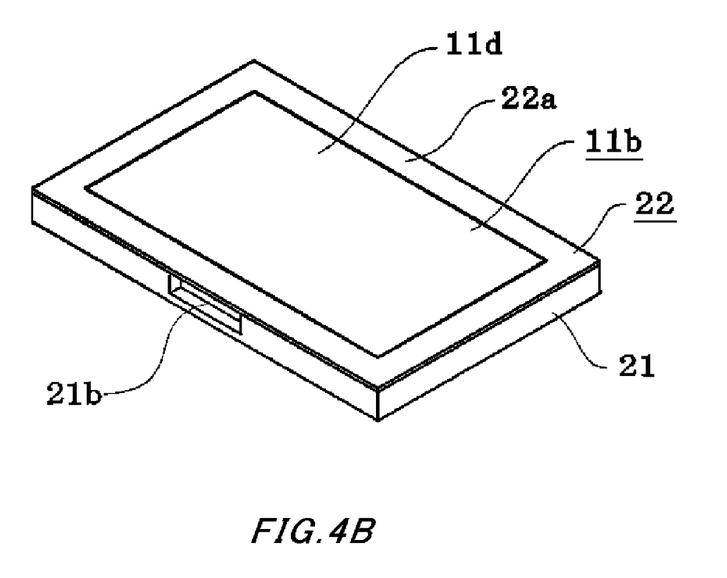

At this time, as shown in FIG. 4A, the cushion 24 is brought into slight contact with the upper surface of the engagement part 11c. However, there is a clearance d1 between the rear surface of the bezel 22 and the engagement part 11c, and there is a clearance d2 between the inner peripheral side of the bezel 22 and the design panel 11b.

This retards the attenuation of the perpendicular vibration f of the touch panel assembly 11 caused by the variation of the vibration elements 12 being expanded or contracted as shown in FIG. 1A while allowing the cushion 24 to prevent the entry of dust particles or the like through the clearances.

Thus, the cushion 24 is soft enough not to inhibit the perpendicular vibration of the touch panel assembly 11.

In this embodiment, the mount frame 23 is made of rubber compact with the accommodating space provided in the lower portion for the display device 30. Furthermore, as shown in FIGS. 2 and 3, there are formed small projections 23b on the inner peripheral surface of the mounting part of the touch panel assembly 11, thereby preventing sideward looseness without inhibiting the perpendicular vibration of the touch panel assembly 11.

On the other hand, this embodiment is an example provided with a connection 21b to an external control unit. However, the control unit may also be provided in the case main body.

As can be seen from above, the inner peripheral rear surface of the bezel 22 is overlapped with the upper surface of the stepped engagement part 11c of the touch panel assembly 11 with the cushion 24 interposed therebetween. Thus, even when the product is dropped and thereby subjected to an impact, the touch panel assembly 11 would never be dislodged from the case assembly.

Furthermore, in this embodiment, the engagement part 11c is formed along the entire outer periphery of the touch panel assembly 11. However, the engagement part 11c needs not to be provided along the entire periphery.

What is claimed is:

1. A touch panel support comprising a touch panel assembly and a case assembly for supporting the touch panel assembly, wherein:
   the touch panel assembly has, on a periphery thereof, a stepped engagement part having a front surface that is recessed with respect to a front surface of the touch panel assembly;
   the case assembly includes a case main body for accommodating the touch panel assembly so as to allow a force feedback perpendicular vibration, the case main body having an opening, and a bezel which is secured to the opening of the case main body;
   the bezel has a groove-shaped portion formed along an inner periphery on a rear surface thereof and opposed to the front surface of the engagement part of the touch panel assembly;
   the bezel is engaged with the engagement part of the touch panel assembly such that a soft cushion provided in the groove-shaped portion contacts the front surface of the engagement part and there is clearance between the rear surface of the bezel and the front surface of the engagement part so as not to inhibit the perpendicular vibration of the touch panel assembly; and
   the front surface of the touch panel assembly and a front surface of the bezel are formed to be flush with each other.

2. The touch panel support according to claim 1, wherein the touch panel assembly includes a panel main body and a design panel so as to form the engagement part by affixing the design panel to a front surface of the panel main body, the design panel having a smaller outer shape than that of the panel main body.

3. The touch panel support according to claim 1, wherein the case main body has a mounting part for receiving the touch panel assembly at four corners of the touch panel assembly.

4. The touch panel support according to claim 1, comprising a unit for vibrating the touch panel assembly in a perpendicular direction, with the unit being a band-shaped piezoelectric element affixed onto a rear surface of the touch panel assembly, and wherein
   the touch panel assembly is an electrostatic capacitance type touch panel assembly.

\* \* \* \* \*